(12) United States Patent
Cheng et al.

(10) Patent No.: US 9,016,675 B2
(45) Date of Patent: Apr. 28, 2015

(54) APPARATUS AND METHOD FOR SUPPORTING A WORKPIECE DURING PROCESSING

(75) Inventors: Chi Wah Cheng, Hong Kong (CN); Lap Kei Chow, Hong Kong (CN); Chi Hang Leung, Hong Kong (CN)

(73) Assignee: ASM Technology Singapore Pte Ltd, Singapore (SG)

(*) Notice: Subject to any disclaimer, the term of this patent is extended or adjusted under 35 U.S.C. 154(b) by 23 days.

(21) Appl. No.: 13/542,785

(22) Filed: Jul. 6, 2012

(65) Prior Publication Data
US 2014/0008855 A1    Jan. 9, 2014

(51) Int. Cl.
B25B 11/00    (2006.01)
C23C 16/00    (2006.01)
C23F 1/00     (2006.01)
B24B 7/00     (2006.01)
B24B 9/00     (2006.01)
B28D 5/00     (2006.01)
H01L 21/67    (2006.01)
H01L 21/687   (2006.01)
H01L 21/683   (2006.01)

(52) U.S. Cl.
CPC ........ B28D 5/0094 (2013.01); H01L 21/67126 (2013.01); H01L 21/6838 (2013.01); H01L 21/68792 (2013.01); Y10T 29/49998 (2015.01)

(58) Field of Classification Search
USPC ............... 269/21; 118/719, 726, 730, 500; 156/345.1, 345.12, 345.51; 277/436
See application file for complete search history.

(56) References Cited

U.S. PATENT DOCUMENTS

| | | | | | |
|---|---|---|---|---|---|
| 2,076,747 | A | * | 4/1937 | Salisbury | 277/377 |
| 2,684,033 | A | * | 7/1954 | Montgomery et al. | 415/113 |
| 2,957,735 | A | * | 10/1960 | Snyder | 92/240 |
| 3,033,582 | A | * | 5/1962 | Creavey | 277/612 |
| 3,052,196 | A | * | 9/1962 | Gilmore | 425/288 |
| 3,199,831 | A | * | 8/1965 | Sully | 251/149.6 |
| 3,768,819 | A | * | 10/1973 | Burkert | 277/647 |
| 4,658,847 | A | * | 4/1987 | McCrone | 137/72 |
| 4,667,944 | A | * | 5/1987 | Althouse | 269/21 |
| 4,804,290 | A | * | 2/1989 | Balsells | 403/326 |
| 4,877,272 | A | * | 10/1989 | Chevallier et al. | 285/111 |
| 4,886,281 | A | * | 12/1989 | Ehrmann et al. | 277/560 |
| 5,354,072 | A | * | 10/1994 | Nicholson | 277/647 |
| 5,518,257 | A | * | 5/1996 | Breaker | 277/612 |
| 5,799,953 | A | * | 9/1998 | Henderson | 277/554 |
| 5,803,797 | A | * | 9/1998 | Piper | 451/182 |
| 5,813,674 | A | * | 9/1998 | Dickie et al. | 277/395 |
| 5,840,125 | A | * | 11/1998 | Gronet et al. | 118/730 |

(Continued)

Primary Examiner — Lee D Wilson
Assistant Examiner — Alvin Grant
(74) Attorney, Agent, or Firm — Ostrolenk Faber LLP

(57) ABSTRACT

An apparatus for supporting a workpiece during processing of the workpiece is disclosed. The apparatus comprises: a chassis having a vacuum chamber that is connectable to a vacuum source; a supporting device rotatable relative to the chassis, the supporting device having a hollow compartment and a supporting surface for holding the workpiece; and at least one sealing device arranged between the chassis and the supporting device, to provide an air-tight seal between the chassis and the supporting device while allowing for rotation of the supporting device with respect to the chassis, so as to form a vacuum passage extending from the supporting surface of the supporting device through the hollow compartment of the supporting device and the vacuum chamber of the chassis to the vacuum source, to thereby hold the workpiece to the supporting surface of the supporting device during processing of the workpiece.

10 Claims, 4 Drawing Sheets

(56) References Cited

U.S. PATENT DOCUMENTS

| | | | |
|---|---|---|---|
| 5,858,587 A * | 1/1999 | Yamane et al. | 430/22 |
| 5,883,932 A * | 3/1999 | Chiba et al. | 378/34 |
| 5,999,589 A * | 12/1999 | Chiba et al. | 378/34 |
| 6,024,631 A * | 2/2000 | Piper | 451/41 |
| 6,072,157 A | 6/2000 | Klebanoff et al. | 219/228 |
| 6,328,096 B1 * | 12/2001 | Stone et al. | 165/80.1 |
| 6,443,459 B2 * | 9/2002 | Lebeau et al. | 277/372 |
| 6,454,272 B1 * | 9/2002 | Iversen | 277/436 |
| 6,464,790 B1 * | 10/2002 | Sherstinsky et al. | 118/715 |
| 6,634,650 B2 * | 10/2003 | Lerner | 279/3 |
| 6,660,089 B2 * | 12/2003 | Nozawa et al. | 118/500 |
| 7,150,792 B2 * | 12/2006 | Fujii et al. | 118/726 |
| 7,425,003 B2 * | 9/2008 | Anderson et al. | 277/647 |
| 7,445,015 B2 * | 11/2008 | Kroeker | 134/140 |
| 7,708,860 B2 * | 5/2010 | Arita et al. | 156/345.51 |
| 8,070,880 B2 * | 12/2011 | Marubayashi et al. | 118/719 |
| 8,091,419 B2 * | 1/2012 | Vontell et al. | 73/147 |
| 8,443,864 B2 * | 5/2013 | Thallner | 156/758 |
| 2002/0096116 A1 * | 7/2002 | Tamura et al. | 118/728 |
| 2002/0104618 A1 * | 8/2002 | Tamura et al. | 156/345.51 |
| 2002/0117810 A1 * | 8/2002 | Schemm | 277/553 |
| 2003/0001103 A1 * | 1/2003 | Kobayashi et al. | 250/440.11 |
| 2004/0185670 A1 * | 9/2004 | Hamelin et al. | 438/704 |
| 2005/0072527 A1 * | 4/2005 | Gunji et al. | 156/345.12 |
| 2005/0118935 A1 * | 6/2005 | Togawa et al. | 451/41 |
| 2009/0116936 A1 * | 5/2009 | Marubayashi et al. | 414/148 |
| 2009/0201622 A1 * | 8/2009 | Brown et al. | 361/234 |
| 2010/0058986 A1 | 3/2010 | Kidd et al. | |
| 2010/0086383 A1 * | 4/2010 | Lee et al. | 414/217 |
| 2010/0089531 A1 * | 4/2010 | Lee et al. | 156/345.1 |
| 2011/0162959 A1 * | 7/2011 | Okada et al. | 204/192.1 |
| 2011/0297321 A1 * | 12/2011 | Matsuda et al. | 156/345.51 |

\* cited by examiner

APPARATUS AND METHOD FOR SUPPORTING A WORKPIECE DURING PROCESSING

FIELD OF THE INVENTION

The present invention relates to an apparatus and method for supporting a workpiece during processing. Such an apparatus and method is particularly but not exclusive for supporting a semiconductor wafer during singulation of the same.

BACKGROUND OF THE INVENTION

Conventionally, a workpiece (e.g. a tape, a substrate, or a strip) is held by vacuum to a chuck table during a cutting process. The chuck table can provide forward, backward, and rotational motion. In particular, the chuck table can move forward so that the rotating blade(s) of a cutting device on top of the workpiece cuts the workpiece that is placed on the chuck table. After cutting of the workpiece is completed in a first direction, a positioning device (e.g. a theta motor or a belt driven by an external rotary motor) rotates the chuck table by 90 degrees, so that cutting of the workpiece can be performed in a second direction that is perpendicular to the first direction. In this way, the workpiece can be cut by the cutting device to obtain an array of smaller units.

In the case of a workpiece that is held to the chuck table via a tape, the top side of the tape comprises a layer of adhesive for holding the workpiece, while vacuum from the chuck table holds the tape from its bottom side. Due to the soft and thin (less than 0.5 mm) nature of the tape, gaps between the chuck table and tape can be sealed up to prevent vacuum leakage. This ensures that the workpiece is firmly held to the chuck table via the tape, so that the workpiece can be accurately cut by the cutting device.

In contrast, holding a workpiece onto the chuck table by vacuum via a rubber jig is more difficult than via the tape. First, warpage of the workpiece due to internal stress within the workpiece coupled with the absence of an adhesive layer at the top side of the rubber jig may result in the presence of micro gaps between the rubber jig and the workpiece. Secondly, the rubber jig is harder and thicker than the tape and thus, micro gaps may also exist between the chuck table and the rubber jig. Consequently, the presence of micro gaps would compromise the stability of the workpiece during the cutting process. Vibration of the workpiece during the cutting process further increases the likelihood of chipping and damage of the workpiece.

FIG. 1a shows a conventional singulation apparatus 100 comprising: i) a chassis 109; ii) a rotary chuck table 110 rotatable relative to the chassis 109, the chuck table 110 being operative to hold a workpiece 104 thereto via a rubber jig 106; and iii) a cutting device 103 with rotating blades 105 for cutting the workpiece 104. In order to provide vacuum for holding the workpiece 104 to the chuck table 110, a plurality of vacuum tubes 108 are connected to vacuum holes 111 of the chuck table 110 and housed within an interior compartment of the chassis 109. During operation, the vacuum tubes 108 are capable of bending and twisting as the chuck table 110 moves linearly and/or rotates relative to the chassis 109.

FIG. 1b shows another conventional singulation apparatus 120 that is similar to the singulation apparatus 100 shown in FIG. 1a. Like the singulation apparatus 100, the singulation apparatus 120 comprises: i) a chassis 129; ii) a rotary chuck table 130 rotatable relative to the chassis 129, the chuck table 130 being operative to hold a workpiece 124 thereto via a rubber jig 126; iii) a cutting device 123 having rotating blades 125 for cutting the workpiece 124; and iv) a plurality of vacuum tubes 128 connected to vacuum holes 121 of the chuck table 130. In contrast with the singulation apparatus 100 of FIG. 1a, however, the vacuum tubes 128 of the singulation apparatus 120 of FIG. 1b are located at an exterior and not within an interior compartment of the chassis 129.

The quantity of the vacuum tubes 108, 128 in the singulation apparatus 100, 120 should thus be limited. Otherwise, the positioning device that rotates the chuck table 110, 130 cannot provide enough torque to overcome torsion forces created by the twisted vacuum tubes 108, 128. Moreover, the requirement to have sufficient space for storing the vacuum tubes 108, 128 that connect to the vacuum holes of the chuck table 110 also presents a further constraint. As the vacuum force increases proportionally with the total number of vacuum tubes 108, 128, the vacuum force created in the singulation apparatus 100, 120 may not be strong enough to hold the workpiece firmly during cutting. Consequently, the workpiece may vibrate during operation, which increases the likelihood of damage to the workpiece and/or the cutting blade during operation.

Thus, it is an object of the present invention to propose an apparatus and method for supporting a workpiece during processing that address the problems faced by conventional apparatus as described above.

SUMMARY OF THE INVENTION

A first aspect of the invention is an apparatus for supporting a workpiece during processing of the workpiece. The apparatus comprises: i) a chassis having a vacuum chamber that is connectable to a vacuum source; ii) a supporting device rotatable relative to the chassis, the supporting device having a hollow compartment and a supporting surface for holding the workpiece; and iii) at least one sealing device arranged between the chassis and the supporting device, to provide an air-tight seal between the chassis and the supporting device while allowing for rotation of the supporting device with respect to the chassis, so as to form a vacuum passage extending from the supporting surface of the supporting device through the hollow compartment of the supporting device and the vacuum chamber of the chassis to the vacuum source, to thereby hold the workpiece to the supporting surface of the supporting device during processing of the workpiece. Such an apparatus may also be used in a singulation apparatus having a cutting device for singulating a semiconductor wafer, wherein the semiconductor wafer is held to the supporting device of the apparatus while being singulated by the cutting device.

A second aspect of the invention is a method of supporting a workpiece using a supporting apparatus to process the workpiece, the supporting apparatus having i) a chassis with a vacuum chamber that is connectable to a vacuum source, and ii) a supporting device rotatable relative to the chassis, the supporting device having a hollow compartment and a supporting surface for holding the workpiece, the method comprising the steps of: i) providing at least one sealing device between the chassis and the supporting device to provide an air-tight seal between the chassis and the supporting device while allowing rotation of the supporting device with respect to the chassis; and ii) forming a vacuum passage from the supporting surface of the supporting device supporting the workpiece through the hollow compartment of the supporting device and the vacuum chamber of the chassis to the vacuum source, so as to hold the workpiece to the supporting surface of the supporting device during processing the workpiece.

Some preferred but optional features/steps of the invention are defined in the dependent claims.

BRIEF DESCRIPTION OF THE DRAWINGS

Preferred embodiments of the invention will now be described, by way of example only, with reference to the accompanying drawings, of which.

DETAILED DESCRIPTION OF THE PREFERRED EMBODIMENTS

Figure 1A:
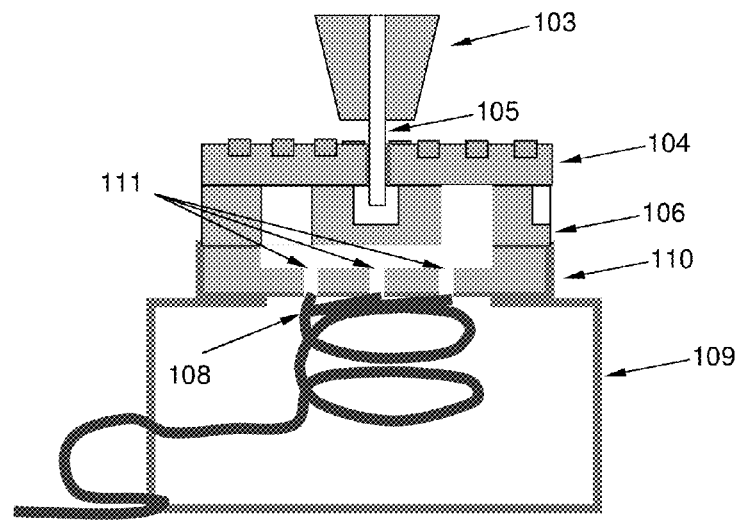
FIG. 1a and FIG. 1b show conventional singulation apparatus in which vacuum tubes are housed within an interior and at an exterior of the singulation apparatus respectively.
Figure 1B:
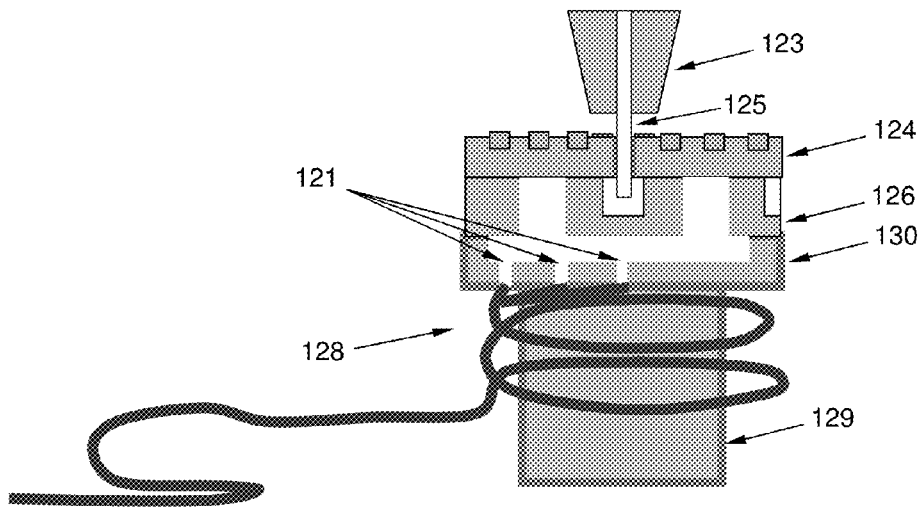
Figure 2:
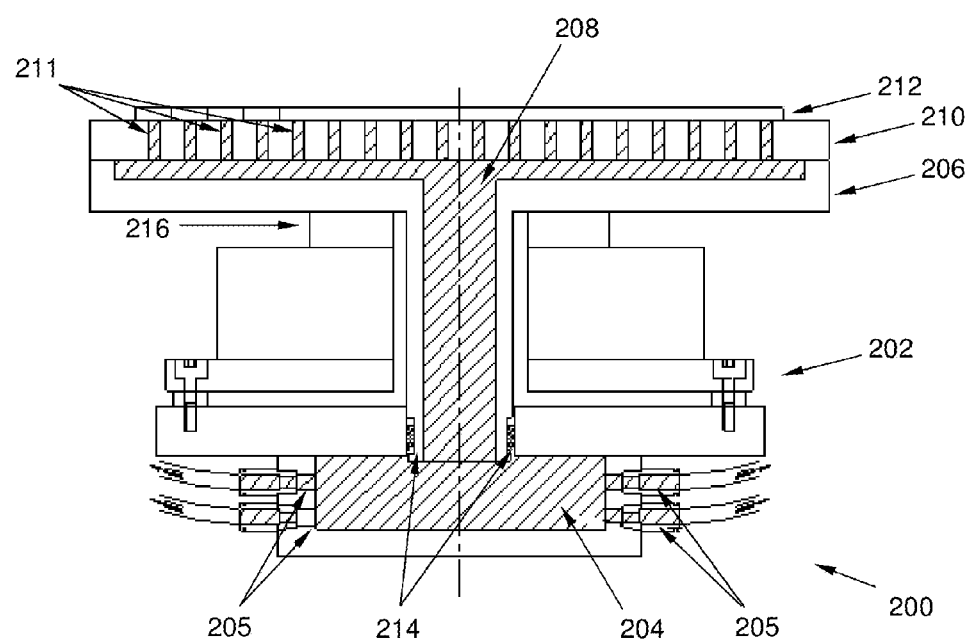
FIG. 2 shows a cross-sectional side view of a singulation apparatus having a sealing device according to a preferred embodiment of the invention.

FIG. 2 shows a cross-sectional side view of a singulation apparatus 200 according to a preferred embodiment of the invention. The singulation apparatus 200 comprises: i) a chassis 202; ii) a supporting device (shown as a rotary chuck table 206) which is rotatable relative to the chassis 202; iii) a positioning device (shown as a motor top plate 216) coupled to the chuck table 206 for rotating the chuck table 206 relative to the chassis 202; and iv) a sealing device 214 arranged between the chassis 202 and the chuck table 206.

Specifically, the chassis 202 includes a vacuum chamber 204 having respective outlets 205 for connecting to one or more vacuum sources (not shown). The chuck table 206 comprises a supporting surface for holding a rubber jig 210, together with a workpiece 212 (e.g. a semiconductor wafer) placed on the rubber jig 210. The chuck table 206 also comprises a hollow interior compartment 208 in fluid communication with corresponding through-holes 211 of the rubber jig 210 and with the vacuum chamber 204 of the chassis 202.

In particular, the sealing device 214 provides an air-tight seal between the chassis 202 and the chuck table 206 while allowing for rotation of the chuck table 206 with respect to the chassis 202. Accordingly, a vacuum passage can be formed within the singulation apparatus 200 (shown by the hatched regions in FIG. 2) extending from the through-holes 211 of the rubber jig 210, through the hollow compartment 208 of the chuck table 206 and the vacuum chamber 204 of the chassis 202, to the one or more vacuum sources. Consequently, the workpiece 212 can be held on the supporting surface of the chuck table 206 via the vacuum forces acting through the through-holes 211 of the rubber jig 210.

In addition, a cutting device (not shown) is further arranged relative to the chuck table 206 to cut the workpiece 212 as the latter is being held to the supporting surface of the chuck table 206 via the rubber jig 210 by the vacuum forces.

It should be appreciated that the chassis 202, the chuck table 206, and the sealing device 214 should be sturdy enough to withstand pressure differentials (either positive or negative) between the ambient environment and the hollow compartment 208 of the singulation apparatus 200. In addition, the chassis 202 and the chuck table 206 should also be resistant to debris particles, deionized water, and chilled water that is as low as 5 degrees Celsius.

Figure 3:
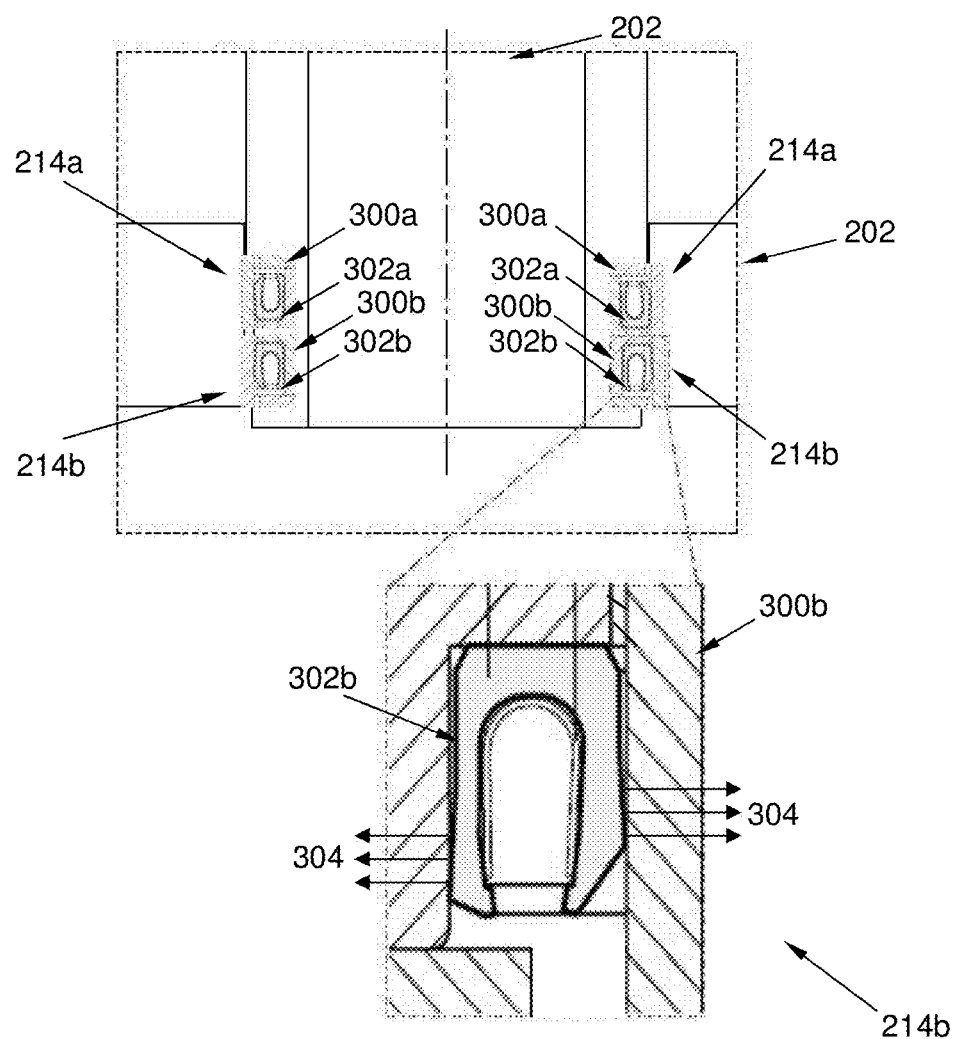
FIG. 3 shows an enlarged view of the sealing device of the singulation apparatus of FIG. 2.

FIG. 3 shows an enlarged view of the sealing device 214 of the singulation apparatus 200, showing the sealing device 214 having two sealing rings 214a, 214b each comprising a ring structure. It can be seen that the sealing rings 214a, 214b comprise polymeric materials 300a, 300b (e.g. a polytetrafluroethylene (PTFE) based materials), and biasing devices 302a, 302b (e.g. stainless steel springs) arranged relative to the polymeric materials 300a, 300b to urge the polymeric materials 300a, 300b against the chassis 202 and the chuck table 206 to thereby provide an air-tight seal therebetween.

Specifically, the polymeric materials 300a, 300b of the sealing rings 214a, 214b have generally U-shaped cross-sections with the corresponding biasing devices 302a, 302b being arranged within the U-shaped cross-sections to urge the sides of the U-shaped cross-sections of the polymeric materials 300a, 300b against the chassis 202 and the chuck table 206 respectively. Such urging forces are shown by arrows 304 in the close-up view of the bottom sealing ring 214b in FIG. 3.

More specifically, the top sealing ring 214a corresponds to an external sealing ring wherein the open-end of the U-shaped cross-section of its polymeric material 300a is in fluid communication with the ambient environment. When the one or more vacuum sources are activated to create the vacuum passage within the singulation apparatus 200, a negative pressure differential that is created between the interior of the singulation apparatus 200 and the ambient environment results in a downward force acting on the open-end of the U-shaped cross-section of the top sealing ring's 214a polymeric material 300a. Accordingly, the sides of the polymeric material's 300a U-shaped cross-section are urged against the chassis 202 and the chuck table 206 respectively to create a stronger air-tight seal therebetween to seal up any existing gaps. Preferably, the stronger air-tight seal between the chassis 202 and the chuck table 206 still allows for rotation of the chuck table 206 with respect to the chassis 202. Accordingly, the top sealing ring 214a prevents leakage of vacuum from within the singulation apparatus 200 to the ambient environment during operation.

On the other hand, the bottom sealing ring 214b corresponds to an internal sealing ring wherein the open-end of the U-shaped cross-section of its polymeric material 300b is in fluid communication with the hollow compartment 208 of the chuck table 206. A positive pressure differential created between the interior of the singulation apparatus 200 and the ambient environment results in an upward force acting on the open-end of the U-shaped cross-section of the polymeric material 300b of the bottom sealing ring 214b. Accordingly, the sides of the polymeric material's 300b U-shaped cross-section are urged against the chassis 202 and the chuck table 206 respectively to create a stronger air-tight seal therebetween to seal up any existing gaps. Preferably, the positive pressure differential is also created by the one or more vacuum sources, and the stronger air-tight seal between the chassis 202 and the chuck table 206 still allows for rotation of the chuck table 206 with respect to the chassis 202. Accordingly, the bottom sealing ring 214b prevents contaminants (e.g. debris and water) within the singulation apparatus 200 from entering into the ambient environment during operation.

It should be appreciated that the polymeric materials 300a, 300b of the sealing rings 214a, 214b should have a low coefficient of friction to allow rotation of the chuck table 206 with respect to the chassis 202. The polymeric materials 300a, 300b should also have a high abrasion resistance and the ability to withstand rapid changes in temperature. It should also be appreciated that other cross-sections of the polymeric material 300a, 300b of the sealing rings 214a, 214b are also envisaged, besides the generally U-shaped cross-section of the polymeric material 300b as shown in the close-up view of the bottom sealing ring 214b in FIG. 3. For instance, the cross-section of the polymeric material 300a, 300b of the sealing rings 214a, 214b may be such that it completely surrounds the biasing devices 302a, 302b.

A set-up procedure and operation of the singulation apparatus 200 will now be described.

The set-up procedure of the singulation apparatus 200 first comprises the step of arranging the sealing rings 214a, 214b between the chassis 202 and the chuck table 206 to provide the air-tight seal therebetween, while allowing for rotation of the chuck table 206 relative to the chassis 202. In particular, the step of arranging the sealing rings 214a, 214b between the chassis and the chuck table 206 comprises the step of urging the polymeric materials 300a, 300b against the chassis 202 and the chuck table 206 to provide the air-tight seal therebetween.

Specifically, the respective biasing devices 300a, 300b are arranged within the U-shaped cross-section of the polymeric materials 300a, 300b to urge the two sides of the U-shaped cross-section of the polymeric materials 300a, 300b against the chassis 202 and the chuck table 206 respectively. More specifically, the top sealing ring 214a corresponding to an external sealing ring is orientated such that the open-end of the U-shaped cross-section of its polymeric material 300a is in fluid communication with the ambient environment to prevent leakage of the vacuum from within the hollow compartment 208 of the chuck table 206 and the vacuum chamber 204 of the chassis 202 to the ambient environment during operation. The bottom sealing ring 214b corresponding to an internal sealing ring is orientated such that the open-end of the U-shaped cross-section of its polymeric material 300b is in fluid communication with the hollow compartment 208 of the chuck table 206 to prevent contaminants (e.g. debris and water) from within the hollow compartment 208 of the chuck table 206 from entering into the ambient environment during operation. Subsequently, the respective outlets 205 of the chassis 202 are then connected to one or more vacuum sources to create a vacuum passage extending from the through-holes 211 of the rubber jig 210, through the hollow compartment 208 of the chuck table 206 and the vacuum chamber 204 of the chassis 202, to the one or more vacuum sources. The vacuum passage accordingly creates a negative pressure differential between the interior of the singulation apparatus 200 and the ambient environment, which thereby holds the rubber jig 210 together with the workpiece 212 on the supporting surface of the chuck table 206 when the workpiece 212 is being singulated.

After singulation of the workpiece 212 has been completed, the one or more vacuum sources are then switched off. However, the singulated units of the workpiece 212 would still be held onto the chuck table 206 via the rubber jig 210 due to the negative pressure differential between the interior of the singulation apparatus 200 and the ambient environment. In order to equalize the pressure differential so that the singulated units are no longer held to the chuck table 206 by vacuum and can be picked up, a positive pressure differential is created between the interior of the singulation apparatus 200 and the ambient environment to purge the air from inside the vacuum chamber 204 to the ambient environment. However, a pick arm of the singulation apparatus 200 should preferably press against the singulation units to hold them in position, as the positive pressure is being created to purge the air from within the vacuum chamber to the ambient environment.

Figure 4:
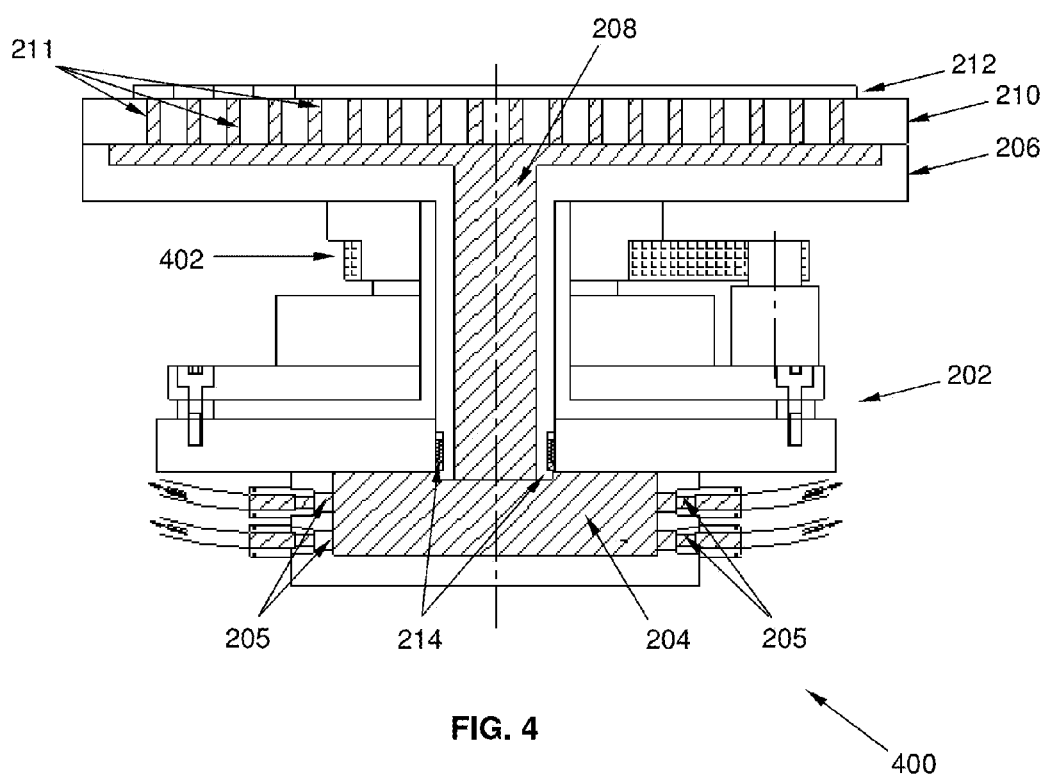
FIG. 4 shows an alternative configuration of the singulation apparatus of FIG. 2.

FIG. 4 shows a singulation apparatus 400 according to another configuration of the singulation apparatus 200 of FIG. 2. The singulation apparatus 400 is largely similar to the previous singulation apparatus 200, and thus, the same reference numerals have been used to indicate identical features between both the singulation apparatus 200, 400. In particular, the singulation apparatus 400 shown in FIG. 4 is different from the previous singulation apparatus 200 only by the configuration of its positioning device. Instead of using the motor top plate 216 to rotate the chuck table 206 relative to the chassis 202, the singulation apparatus 400 comprises a belt 402 driven by an external rotary motor to rotate the chuck table 206 relative to the chassis 202.

By providing the sealing rings 214a, 214b in the singulation apparatus 200, 400, the problems encountered by the conventional singulation apparatus 100, 120 utilising vacuum tubes 108, 128 that are connected to rotary chuck tables 110, 130 are addressed. By way of explanation, larger vacuum forces created in the conventional singulation apparatus 100, 120 would require a correspondingly greater number of vacuum tubes 108, 128, which may be constrained by the limited space within or around the conventional singulation apparatus 100, 120. In contrast, the singulation apparatus 200, 400 according to the preferred embodiments are capable of providing larger vacuum forces as they do not have to take into account space constraints, unlike the conventional singulation apparatus 100, 120. Moreover, the singulation apparatus 200, 400 could also provide larger vacuum forces than the conventional singulation apparatus 100, 120 due to a large cross-sectional area of the vacuum passage as compared with that of the conventional singulation apparatus 100, 120. Consequently, the maximum cutting speed of the singulation apparatus 200, 400 would be higher than that of the conventional singulation apparatus 100, 120, which advantageously results in a higher throughput of the singulation apparatus 200, 400.

Other embodiments of the present invention can also be envisaged without departing from the scope of the invention. For instance, it should be appreciated that the singulation process of the workpiece 212 may either relate to complete cutting (or dicing), or incomplete cutting (e.g. scribing of the workpiece 212 to form linear grooves). Indeed, it should also be appreciated that any other processing operations may be performed on the workpiece 212 (e.g. laser marking, die bonding, and wire bonding) according to other embodiments of the invention, in addition to the singulation of the workpiece 212 as described above. Further, although two sealing rings 214a, 214b have been described in relation to the sealing device 214 of the singulation apparatus 200, 400, it should be appreciated that other embodiments of the invention may comprise one or more than two such sealing rings. It should also be appreciated that the positioning device of the singulation apparatus 200, 400 may also be operative to move the chuck table 206 in linear motion along orthogonal axes or directions for processing the workpiece 212.

The invention claimed is:

1. An apparatus for supporting a workpiece during processing of the workpiece, the apparatus comprising:
   a chassis having a vacuum chamber that is connectable to a vacuum source; a supporting device rotatable relative to the chassis, the supporting device having a hollow compartment and a supporting surface for holding the workpiece; and
   at least one sealing device arranged between the chassis and the supporting device, to provide an air-tight seal between the chassis and the supporting device while allowing for rotation of the supporting device with respect to the chassis, so as to form a vacuum passage extending from the supporting surface of the supporting device through the hollow compartment of the supporting device and the vacuum chamber of the chassis to the vacuum source, to thereby hold the workpiece to the supporting surface of the supporting device during processing of the workpiece, wherein the at least one sealing device comprises:

a polymeric material; and a biasing device arranged relative to the polymeric material to urge the polymeric material against the chassis and the supporting device to provide the air-tight seal therebetween.

2. The apparatus of claim 1, wherein the at least one sealing device comprises a ring structure.

3. The apparatus of claim 1, wherein the polymeric material is a polytetrafluroethylene (PTFE) based material.

4. The apparatus of claim 1, wherein the polymeric material of each of the at least one sealing device has a generally U-shaped cross-section, and the biasing device of the sealing device is arranged within the generally U-shaped cross-section of the polymeric material to urge the sides of the U-shaped cross-section of the polymeric material against the chassis and the supporting device respectively.

5. The apparatus of claim 1, further comprising an external sealing device and an internal sealing device, wherein the open-end of the generally U-shaped cross-section of the polymeric material of the external sealing device being in fluid communication with the ambient environment for further urging the sides of the U-shaped cross-section of the polymeric material against the chassis and the supporting device respectively when the vacuum passage is formed, and the open-end of the generally U-shaped cross-section of the polymeric material of the internal sealing device being in fluid communication with the hollow compartment of the supporting device for further urging the sides of the U-shaped cross-section of the polymeric material against the chassis and the supporting device respectively when a positive pressure differential is formed between the hollow compartment of the supporting device and the vacuum chamber of the chassis, and the ambient environment.

6. An apparatus for singulating a semiconductor wafer, the apparatus comprising:

the apparatus of claim 1; and a cutting device arranged relative to the apparatus of claim 1, the cutting device being for singulating the semiconductor wafer as the semiconductor wafer is held to the supporting surface of the supporting device of the apparatus of claim 1 by the vacuum passage.

7. An apparatus for supporting a workpiece during processing of the workpiece, the apparatus comprising:

a chassis having a vacuum chamber that is connectable to a vacuum source;

a supporting device rotatable relative to the chassis, the supporting device having a hollow compartment and a supporting surface for holding the workpiece; and an external sealing device and an internal sealing device arranged between the chassis and the supporting device, to provide an air-tight seal between the chassis and the supporting device while allowing for rotation of the supporting device with respect to the chassis, so as to form a vacuum passage extending from the supporting surface of the supporting device through the hollow compartment of the supporting device and the vacuum chamber of the chassis to the vacuum source, to thereby hold the workpiece to the supporting surface of the supporting device during processing of the workpiece, wherein the external sealing device comprises:

a polymeric material having a generally U-shaped cross-section, the open-end of the generally U-shaped cross-section of the polymeric material being in fluid communication with the ambient environment for further urging the sides of the U-shaped cross-section of the polymeric material against the chassis and the supporting device respectively when the vacuum passage is formed; and a biasing device arranged within the generally U-shaped cross-section of the polymeric material to urge the polymeric material against the chassis and the supporting device to provide the air-tight seal therebetween; and wherein the internal sealing device comprises:

a polymeric material having a generally U-shaped cross-section, the open-end of the generally U-shaped cross-section of the polymeric material being in fluid communication with the hollow compartment of the supporting device for further urging the sides of the U-shaped cross-section of the polymeric material against the chassis and the supporting device respectively when a positive pressure differential is formed between the hollow compartment of the supporting device and the vacuum chamber of the chassis, and the ambient environment; and a biasing device arranged within the generally U-shaped cross-section of the polymeric material to urge the polymeric material against the chassis and the supporting device to provide the air-tight seal therebetween.

8. The apparatus of claim 7, wherein each of the external and internal sealing devices comprises a ring structure.

9. The apparatus of claim 7, wherein the polymeric material of each of the external and internal sealing devices is a polytetrafluroethylene (PTFE) based material.

10. An apparatus for singulating a semiconductor wafer, the apparatus comprising:

the apparatus of claim 7; and a cutting device arranged relative to the apparatus of claim 7, the cutting device being for singulating the semiconductor wafer as the semiconductor wafer is held to the supporting surface of the supporting device of the apparatus of claim 7 by the vacuum passage.

* * * * *